US012706146B2

(12) United States Patent
Kim et al.

(10) Patent No.: US 12,706,146 B2
(45) Date of Patent: Aug. 11, 2026

(54) NONVOLATILE MEMORY DEVICE WITH REDUCED LATERAL CHARGE

(71) Applicant: Samsung Electronics Co., Ltd., Suwon-si (KR)

(72) Inventors: Seyun Kim, Suwon-si (KR); Kyunghun Kim, Suwon-si (KR); Sunho Kim, Suwon-si (KR); Hyungyung Kim, Suwon-si (KR); Seungyeul Yang, Suwon-si (KR); Gukhyon Yon, Suwon-si (KR); Minhyun Lee, Suwon-si (KR); Joonsuk Lee, Suwon-si (KR); Seokhoon Choi, Suwon-si (KR); Hoseok Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 391 days.

(21) Appl. No.: 18/328,192

(22) Filed: Jun. 2, 2023

(65) Prior Publication Data

US 2024/0221832 A1 Jul. 4, 2024

(30) Foreign Application Priority Data

Jan. 3, 2023 (KR) ........................ 10-2023-0000919

(51) Int. Cl.
*H10B 43/35* (2023.01)
*G11C 16/04* (2006.01)
(Continued)

(52) U.S. Cl.
CPC ......... *G11C 16/0483* (2013.01); *H10B 43/10* (2023.02); *H10B 43/27* (2023.02);
(Continued)

(58) Field of Classification Search
CPC ........ H10B 53/00; H10B 53/10; H10B 53/20; H10B 53/30; H10B 53/40; H10B 53/50;
(Continued)

(56) References Cited

U.S. PATENT DOCUMENTS 8,008,722 B2 8/2011 Kim et al.
8,390,054 B2 3/2013 Ino et al.
(Continued)

FOREIGN PATENT DOCUMENTS

KR 10-2022-0067653 A 5/2022

OTHER PUBLICATIONS

Bongsik Choi et al., "Comprehensive evaluation of early retention (fast charge loss within a few seconds) characteristics in tube-type 3-D NAND Flash Memory", 2016 IEEE Symposium on VLSI Technology, DOI: 10.1109/VLSIT.2016.7573385.
(Continued)

*Primary Examiner* — William B Partridge
*Assistant Examiner* — Gustavo G Ramallo
(74) *Attorney, Agent, or Firm* — Harness, Dickey & Pierce, P.L.C.

(57) ABSTRACT

Provided is a nonvolatile memory device. The nonvolatile memory device includes: a channel layer; a plurality of gate electrodes and a plurality of insulating layers being spaced apart from the channel layer and being alternately arranged; a charge trap layer between the channel layer and a gate electrode, and a charge tunneling layer between the channel layer and the charge trap layer.

20 Claims, 16 Drawing Sheets

(51) Int. Cl.
*H10B 43/10* (2023.01)
*H10B 43/27* (2023.01)
*H10D 62/80* (2025.01)
*H10D 62/84* (2025.01)

(52) U.S. Cl.
CPC ............. *H10B 43/35* (2023.02); *H10D 62/84* (2025.01); *H10D 62/882* (2025.01)

(58) Field of Classification Search
CPC ........ H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS 8,415,674 B2 4/2013 Lim et al.
8,427,865 B2 4/2013 Shima et al.
8,460,998 B2 6/2013 Kim et al.
8,513,729 B2 8/2013 Choe et al.
8,907,398 B2 12/2014 Yun et al.
9,093,369 B2 7/2015 Shin et al.
9,293,335 B2 3/2016 Kim et al.
9,449,985 B1 9/2016 Rabkin et al.
9,525,076 B2 12/2016 Lee et al.
9,947,685 B2 4/2018 Fujii et al.
10,515,980 B2 12/2019 Cheng et al.
10,636,807 B2 4/2020 Itokawa et al.
10,651,195 B2 5/2020 Lee et al.
2010/0163968 A1* 7/2010 Kim ....................... H10B 43/10 257/E21.423
2011/0266611 A1 11/2011 Kim et al.
2017/0330887 A1* 11/2017 Kim ....................... H10B 43/27
2018/0358470 A1* 12/2018 Lee ...................... G11C 13/025
2019/0051656 A1 2/2019 Carlson et al.
2019/0148540 A1 5/2019 Wang et al.
2020/0091165 A1* 3/2020 Yamashita ............. H10B 43/27
2020/0161328 A1 5/2020 Yoon et al.
2020/0266345 A1 8/2020 Yoon et al.
2020/0350497 A1 11/2020 Yoon et al.
2021/0035635 A1 2/2021 Yoon et al.
2021/0035641 A1 2/2021 Yoon et al.
2021/0193207 A1 6/2021 Mizusaki et al.
2021/0193845 A1 6/2021 Siddik et al.
2021/0202833 A1 7/2021 Kim et al.
2021/0202840 A1 7/2021 Kim et al.
2021/0217473 A1 7/2021 Cho et al.
2021/0257378 A1 8/2021 Ueda et al.
2021/0366932 A1* 11/2021 Lee ........................ H10B 51/00
2022/0020437 A1 1/2022 Kim et al.
2022/0020818 A1 1/2022 Kim et al.
2022/0052259 A1 2/2022 Kim et al.
2022/0077235 A1 3/2022 Kim et al.
2022/0238672 A1 7/2022 Lee et al.
2022/0246679 A1 8/2022 Cho et al.
2022/0302380 A1 9/2022 Mizusaki et al.
2022/0310827 A1 9/2022 Kim et al.
2022/0319602 A1 10/2022 Lee et al.
2022/0320135 A1 10/2022 Oh et al.
2023/0217656 A1* 7/2023 Han ....................... H10B 43/27 257/314
2023/0406714 A1 12/2023 In et al.

OTHER PUBLICATIONS

Chen Stern et al., "Growth Mechanisms and Electronic Properties of Vertically Aligned MoS2", Scientific Reports 8,16480 (2018).
Fei Yan et al., "Light Generation in Lead Halide Perovskite Nanocrystals: LEDs, Color Converters, Lasers, and Other Applications", Small, 15, 1902079 (2019).
Qing Hua Wang et al., "Electronics and optoelectronics of two-dimensional transition metal dichalcogenides", Nature Nanotech., 7, 699-712 (2012).
Minoru Osada et al., "Exfoliated oxide nanosheets: new solution to nanoelectronics", J. Mater. Chem., 19, 2503-2511 (2009).
Michael Naguib et al., "25th Anniversary Article: MXenes: A New Family of Two-Dimensional Materials", Adv. Mater. 26, 992-1005 (2014).
KR Office Action dated May 21, 2026 issued in corresponding Korean Patent Application No. 10-2023-0000919.

* cited by examiner

NONVOLATILE MEMORY DEVICE WITH REDUCED LATERAL CHARGE

CROSS-REFERENCE TO RELATED APPLICATION

This application is based on and claims priority under 35 U.S.C. § 119 to Korean Patent Application No. 10-2023-0000919, filed on Jan. 3, 2023, in the Korean Intellectual Property Office, the disclosure of which is incorporated by reference herein in its entirety.

BACKGROUND

Various example embodiments relate to a nonvolatile memory device and/or a method for fabricating the same.

Nonvolatile memory devices as semiconductor memory devices in which stored data is not lost even when the supply of power is interrupted, may include, for example, Programmable Programmable ROMs (PROMs), Erasable Programmable PROMs (EPROMs), Electrically Erasable Programmable EPROMs (EEPROMs), flash memory devices, and/or the like.

In order to increase the capacity of nonvolatile memory devices, it is necessary or desirable to increase the density of a cell and/or to prevent or reduce the lateral charge spreading of a charge trap layer.

SUMMARY

One or more example embodiments provide a nonvolatile memory device with reduced lateral charge spreading of a charge trap layer, and a method for fabricating the same.

Additional aspects will be set forth in part in the description which follows and, in part, will be apparent from the description, or may be learned by practice of the presented embodiments of the disclosure.

According to various example embodiments, a nonvolatile memory device includes a channel layer extending in a first direction; a plurality of gate electrodes and a plurality of insulating layers spaced apart from the channel layer being alternately arranged, a charge trap layer between the channel layer and a gate electrode, and a charge tunneling layer between the channel layer and the charge trap layer. The charge trap layer may include a two-dimensional material, and the two-dimensional material may include a region having an inclined crystalline structure with respect to the channel layer.

Alternatively or additionally, according to some example embodiments, a method for fabricating a nonvolatile memory device includes alternately stacking a plurality of sacrificial layers and a plurality of insulating layers in a first direction, etching the plurality of sacrificial layers and the plurality of insulating layers to form a channel hole, forming a charge trap layer on an inner side of the channel hole, forming a charge tunneling layer on an inner side of the charge trap layer, and forming a channel layer on an inner side of the charge tunneling layer, wherein the charge trap layer may include a two-dimensional material, and the two-dimensional material may include a region having an inclined crystalline structure with respect to the channel layer.

BRIEF DESCRIPTION OF THE DRAWINGS

The above and other aspects, features, and advantages of certain example embodiments may be more apparent from the following description taken in conjunction with the accompanying drawings, in which.

DETAILED DESCRIPTION

Figure 1:
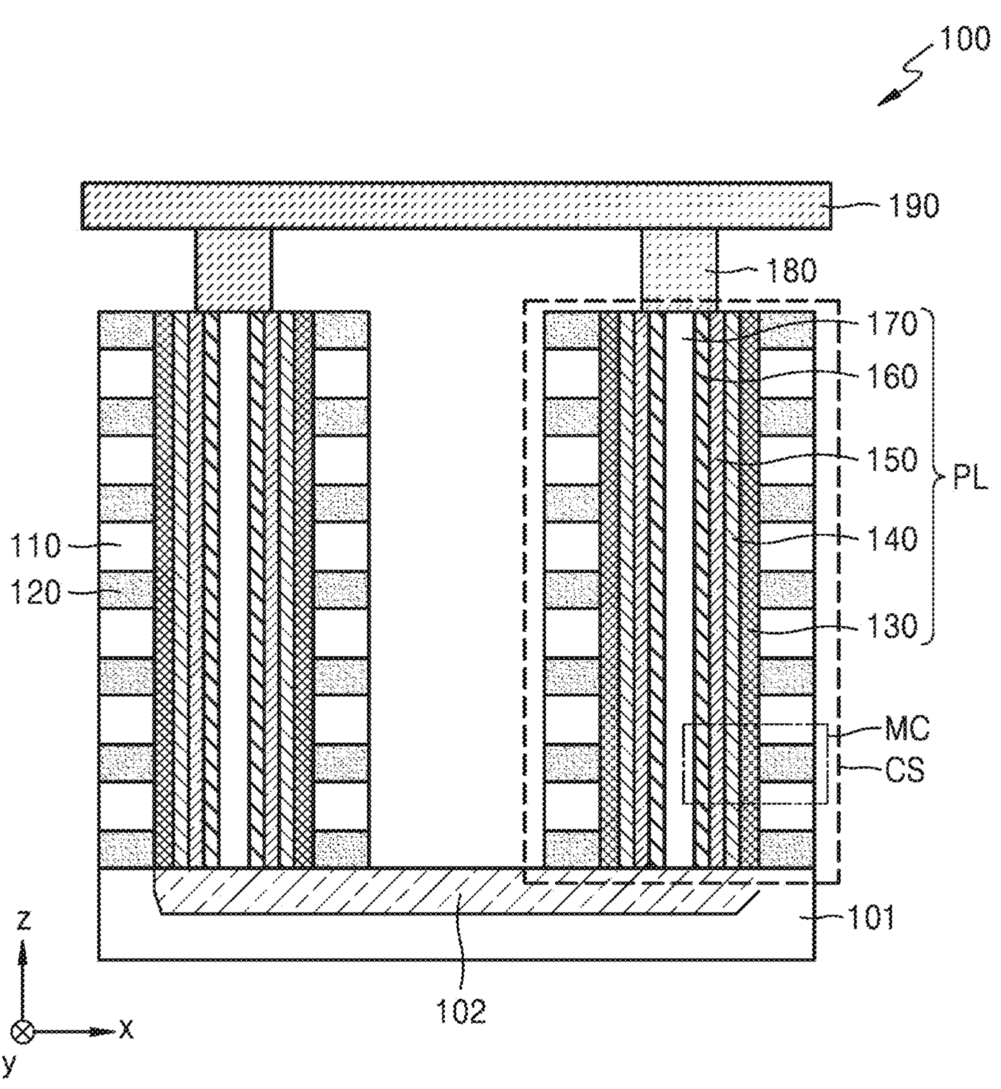
FIG. 1 is a cross-sectional view showing a schematic structure of a nonvolatile memory device according to some example embodiments.

Reference will now be made in detail to various embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, various embodiments will be described in detail with reference to the accompanying drawings. Examples to be described are just illustrative, and various modifications are possible from these embodiments. In the following drawings, the same reference numerals refer to the same elements, and in the drawings, the sizes of the elements may be exaggerated for clarity and convenience of explanation.

Hereinafter, what is referred to as "above" or "on" may include not only directly in a contact manner but also in a non-contact manner.

The terms first, second, etc. may be used to describe various components, but are used only for the purpose of distinguishing one component from another component. These terms are not intended to limit the material or structure of the components.

The expression of the singular includes a plurality of representations, unless the context clearly indicates otherwise. In addition, when a certain portion is referred to as "including" any component, this means that other components can be further included, rather than excluding other components unless otherwise stated.

In addition, the terms " . . . unit", "module" or the like means a unit for processing at least one function or operation, which can be implemented in hardware or software or a combination of hardware and software.

The use of the term "the" and similar instruction terms may correspond to both singular and plural.

If there is no obvious indication that the steps of configuring the method should be done in the stated order, it can be done in a suitable order. In addition, the use of all exemplary terms (e.g., etc.) is merely for describing the technical idea in detail and is not limited by the claims, and thus the scope of rights is not limited by the term.

A nonvolatile memory device according to some example embodiments may be or may include or be included in a vertical NAND (VNAND) memory in which a plurality of memory cells MC are arrayed in a vertical direction.

The detailed configuration of the nonvolatile memory device will be described below with reference to FIGS. 1 through 4.

Figure 2:
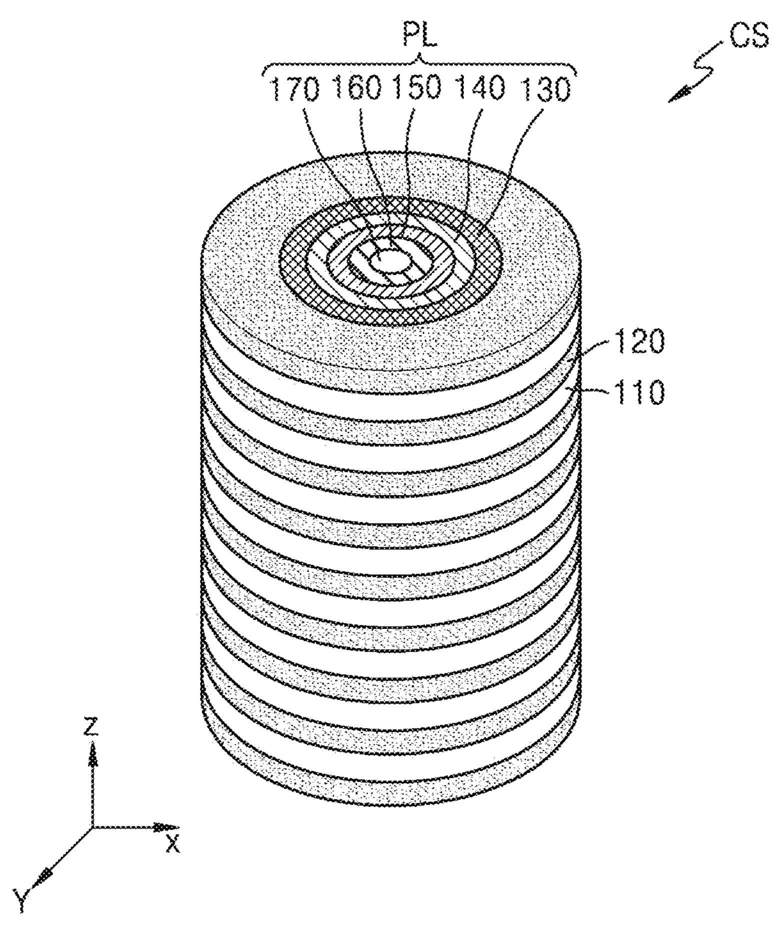
FIG. 2 is a perspective view showing a schematic structure of a memory string provided in the nonvolatile memory device of FIG. 1.
Figure 3:
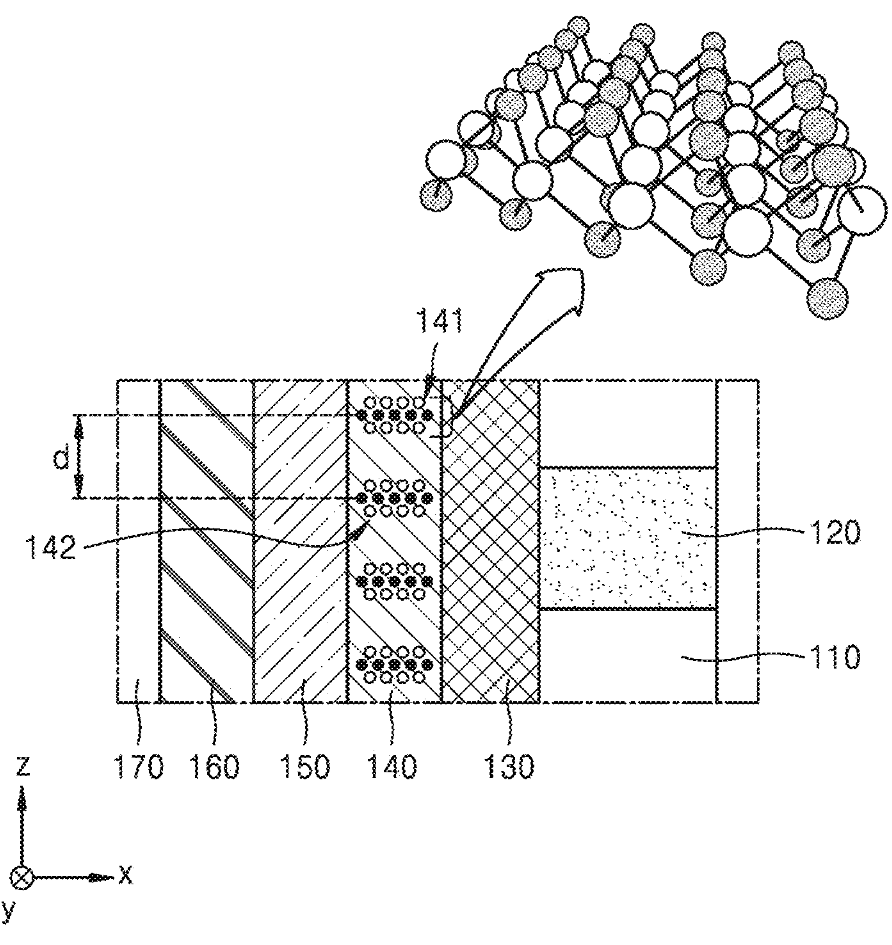
FIG. 3 is a cross-sectional view showing a schematic structure of a memory cell of FIG. 1.
Figure 4:
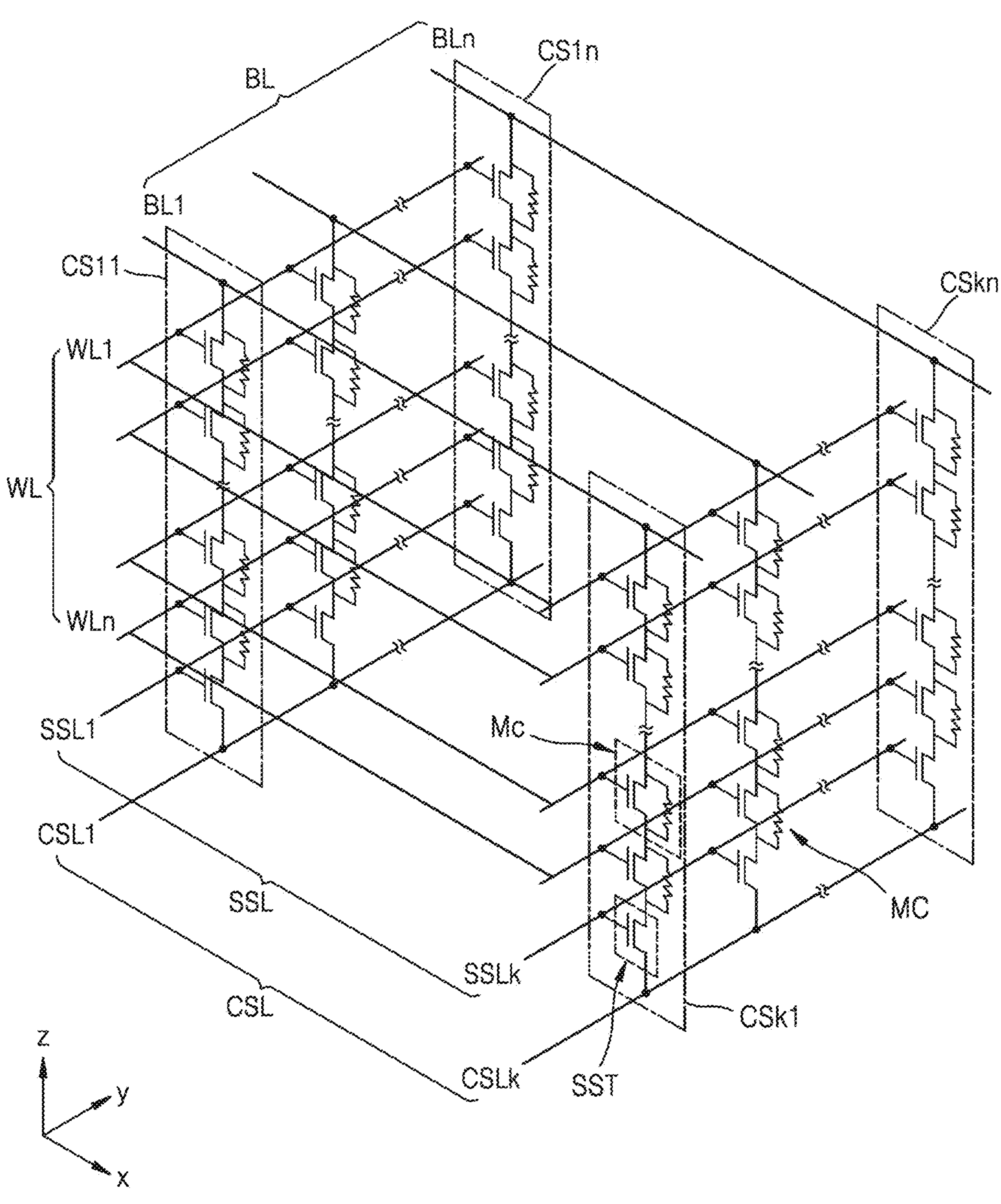
FIG. 4 is an equivalent circuit diagram of the nonvolatile memory device of FIG. 1.

FIG. 1 is a cross-sectional view showing a schematic structure of a nonvolatile memory device 100 according to some example embodiments, and FIG. 2 is a perspective view showing a schematic structure of a memory string provided in the nonvolatile memory device 100 of FIG. 1. FIG. 3 is a cross-sectional view showing a schematic structure of a memory cell MC of FIG. 1. FIG. 4 is an equivalent circuit diagram of the nonvolatile memory device 100 of FIG. 1.

Referring to FIG. 1, a plurality of cell strings CS may be provided on a substrate 101. Referring to FIG. 2, each of the plurality of cell strings CS may include a pillar such as a cylindrical or tapered pillar PL, a plurality of insulating layers 110 and a plurality of gate electrodes 120, which surround the pillar PL in a ring form. The plurality of insulating layers 110 and the plurality of gate electrodes 120 may be alternately stacked to one another in a direction perpendicular to the substrate 101.

Each of the plurality of insulating layers 110 may have the same thickness as each other, or at least one of the plurality of insulating layers 110 may have a thickness different from (e.g., greater than and/or less than) others of the plurality of insulating layers 110. Each of the plurality of gate electrodes 120 may have the same thickness as each other, or at least one of the plurality of gate electrodes 120 may have a thickness different from (e.g., greater than and/or less than) others of the plurality of gate electrodes 120. Each of the plurality of gate electrodes 120 may have the same thickness as, or a thickness greater than or less than, a neighboring one of the plurality of insulating layers 110.

The substrate 101 may include a silicon material doped with a first type impurity. For example, the substrate 101 may include a silicon material doped with a p-type impurity such as but not limited to boron. For example, the substrate 101 may be a p-type well (e.g., a pocket p-well). Hereinafter, it may be assumed that the substrate 101 is p-type silicon, e.g., silicon doped with a group Ill material such as boron. However, the substrate 101 is not limited to the p-type silicon.

A doping region 102 may be on the substrate 101. For example, the doping region 102 may have a second type impurity that is different from that of the substrate 101. For example, the doping region 102 may have an n-type impurity such as but not limited to phosphorus and/or arsenic. Hereinafter, it may be assumed that the doping region 102 is of an n-type. Hereinafter, the doping region 102 is not limited to the n-type. The doping region 102 may be connected to a common source line CSL.

The insulating layers 110 may function as spacers for insulation between conductive layers. The insulating layers 110 not only may function as spacers for maintaining a distance between the gate electrodes 120 but also may prevent or reduce the likelihood of and/or impact from charges trapped in the charge trap layer 140 from spreading toward another cell. The insulating layers 110 may include various insulating materials such as a silicon oxide, a silicon nitride, and the like. The insulating layers 110 may include one or more layers.

The gate electrodes 120 may include metal materials and/or heavily doped silicon materials. Each of the gate electrodes 120 may be connected to one of a word line WL and a string selection line SSL.

The pillar PL may include a plurality of layers. For example, a charge blocking layer 130, a charge trap layer 140, a charge tunneling layer 150, and a channel layer 160 may be sequentially provided on the pillar PL. Thicknesses of each of the charge blocking layer 130, the charge trap layer 140, the charge tunneling layer 150, and the channel layer 160 may be the same as each other, or at least one may be different than (greater than and/or less than) others of the charge blocking layer 130, the charge trap layer 140, the charge tunneling layer 150, and the channel layer 160. Here, when a certain voltage is applied to the gate electrodes 120, charges flowing between a source and drain 180 of the channel 160 may pass through the charge tunneling layer 150 and may be captured in the charge trap layer 140 so that information (such as logical '0' or logical '1') may be stored.

Each of the charge blocking layer 130, the charge trap layer 140, and the charge tunneling layer 150 may extend in a direction perpendicular to the surface of the substrate 101. Each of the charge blocking layer 130, the charge trap layer 140, and the charge tunneling layer 150 may have a cylindrical shape and/or a tapered cylindrical shape.

The charge blocking layer 130 may be conformally provided in the pillar PL. The charge blocking layer 130 may be provided to be in contact with the insulating layers 110 and the gate electrodes 120. The charge blocking layer 130 may function as a barrier for preventing or reducing the likelihood of and/or impact from charge movement between the charge trap layer 140 and the gate electrode 120. A first surface of the charge blocking layer 130 may be in contact with the charge trap layer 140, and a second surface facing the first surface may be in contact with the gate electrode 120. The charge blocking layer 130 may include, for example, a silicon oxide and/or a metal oxide, but embodiments are not limited thereto.

The charge trap layer 140 may be provided along an inner surface of the charge blocking layer 130. The charge trap layer 140 may store introduced charges. The charges (e.g., electrons and/or holes) that are present in the channel layer 160 may be introduced into the charge trap layer 140 due to a tunneling effect or the like. The charges introduced into the charge trap layer 140 may be fixed in the charge trap layer 140.

Here, referring to FIG. 3 together, the charge trap layer 140 may include a two-dimensional material. The 'two-dimensional material' may mean a material of which atoms have a crystalline structure with a thickness of an atomic layer on a two-dimensional plane, and may have a mono-layer or multilayer structure. The z-axis direction may represent a direction perpendicular to a plane on which the crystalline structure (e.g., 141) of the two-dimensional material is formed, and the x-axis direction may represent a direction of a cross-section of the crystalline structure (e.g., 141) of the two-dimensional material in a direction perpendicular to the z-axis direction, and the y-axis direction may represent a direction perpendicular to the x-axis and the y-axis, respectively.

The charge trap layer 140 may include the two-dimensional material, and the two-dimensional material may include a region having an inclined crystalline structure with respect to one surface of the channel layer 160. The above-described 'inclined crystalline structure' may represent a crystalline structure in which an x-y plane of the two-dimensional material crystalline structure (e.g., 141) included in the charge trap layer 140 is not parallel to one surface (e.g., S1 which is one surface in a direction in which the channel layer 160 extends) of the channel layer 160 and forms a certain angle. For example, the 'inclined crystalline structure' may represent a crystalline structure in which the direction perpendicular to one surface (e.g., S1) of the channel layer 160 and the z-axis direction of the two-dimensional material crystalline structure (e.g., 141) form a certain angle.

In some example embodiments, an angle formed between the x-y plane of the two-dimensional material crystalline structure (e.g., 141) and one surface (e.g., S1) of the channel layer 160, may be greater than or equal to 45° and less than or equal to 90°. For example, an angle formed between the z-axis direction of the two-dimensional material crystalline structure (e.g., 141) and a direction perpendicular to one surface (e.g., S1) of the channel layer 160 may be greater than or equal to 45° and less than or equal to 90°.

Each of the crystalline structures (e.g., 141 and 142) of the two-dimensional materials may be arranged in parallel to each other with certain directivity. For example, atomic layers included in the crystalline structures (e.g., 141 and 142) of the two-dimensional materials may be spaced apart from each other. The atomic layers included in the two-dimensional material crystalline structures (e.g., 141 and 142) may be connected to each other by Van der Waals bonding. Thus, lateral charge spreading of the charge trap layer 140 may be prevented or reduce in likelihood of occurrence and/or impact from occurrence. Here, the two-dimensional material crystalline structures (e.g., 141 and 142) may include at least one atomic layer, and a ditance d between adjacent atomic layers may be greater than or equal to 0.1 nm and less than or equal to 5 nm. In addition, the two-dimensional materials may include at least one metal atom, and the at least one metal atom may be in contact with the charge tunneling layer 150. The charge tunneling layer 140 may include at least one two-dimensional material selected from the group consisting of or including, for example, a chalcogenide compound, a metal oxide, Mxene, graphene, and a boron nitride, and example embodiments are not limited thereto.

The chalcogenide compound may be, for example, $M_1N_x$. Here, x may represent a number that is greater than or equal to 1 and less than or equal to 3. In addition, here, M may represent one or more of titanium (Ti), hafnium (Hf), zirconium (Zr), vanadium (V), niobium (Nb), tantalum (Ta), molybdenum (Mo), tungsten (W), technetium (Tc), rhenium (Re), palladium (Pd), platinum (Pt), bismuth (Bi), antimony (Sb), lanthanum (La), cerium (Ce), proscenium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Alternatively or additionally, here, N may be one or more of sulfur (S), selenium (Se), and tellurium (Te).

The metal oxide may include at least one selected from the group consisting of or including, for example, $TiO_x$ (where x is a number that is greater than or equal to 1 and less than or equal to 1), $MnO_2$, $TiNbO_5$, $Ti_2NbO_7$, $TiTaO_5$, $Nb_3O_8$, $Nb_6O_{17}$, $TaO_3$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_2$, and $CS_4W_{11}O_{36}$.

Mxene may include at least one selected from the group consisting of or including, for example, $Ti_2C$, $V_2C$, $Nb_2C$, $Mo_2C$, $Ti_3C_2$, $Zr_3C_2$, $Nb_4C_3$, $Ta_4C_3$, $Ti_4N_3$, TiNbC, $(Ti_{0.5}Nb_{0.5})_2C$, $(V_{0.5}Cr_{0.5})_3C_2$, $Ti_3CN$, $Mo_2TiC_2$, $Mo_2ScC_2$, $Cr_2TiC_2$, $Mo_2Ti_2C_3$, $(Nb_{0.8}Ti_{0.2})_4C_3$, and $(Nb_{0.8}Zr_{0.2})_4C_3$.

The charge trapping layer 140 may not have a uniform distribution of metal cations and anions, and a concentration of the metal cation may be concentrated at an interface of the charge trap layer 140. The ratio of the number of metal cations to the number of anions at the interface of the charge trap layer 140 may be greater than the ratio of the number of metal cations to the number of anions in the entire charge trap layer 140. When the charge trap layer 140 includes a chalcogenide compound, the ratio of the number of metal atoms to the number of chalcogen atoms at the interface of the charge trap layer 140 may be greater than the number of metal atoms compared to the number of chalcogen atoms in the entire charge trap layer 140.

The charge trap layer 140 may include or define a void region. Alternatively or additionally, the charge trap layer 140 may include silicon (Si).

The charge tunneling layer 150 may be provided along an inner surface of the charge trap layer 140. The charge tunneling layer 150 may be a layer in which charge tunneling is performed, for example, a silicon oxide and/or a metal oxide, but embodiments are not limited thereto.

The channel layer 160 may be conformally provided along the inner surface of the charge tunneling layer 150. The channel layer 160 may include a semiconductor material doped with a first type impurity. The channel layer 160 may include a silicon material doped with the same type and/or the same conductivity type impurity as that of the substrate 101, and for example, when the substrate 101 includes a silicon material doped with a p-type impurity, the channel layer 160 may also include a silicon material doped with the p-type impurity. Alternatively or additionally, the channel layer 160 may include a material such as germanium (Ge), indium gallium zinc oxide (IGZO), gallium arsenide (GaAs), or the like. The channel layer 160 may have a cylindrical shape or a tapered shape.

The filling layer 170 may be conformally provided along the inner surface of the channel layer 160. The filling layer 170 may include, for example, a silicon oxide or air, but embodiments are not limited thereto.

The channel layer 160 may be in contact with the doping region 102, i.e., a common source region.

The drain 180 may be provided on the pillar PL. The drain 180 may include a silicon material doped with a second type impurity. For example, the drain 180 may include a silicon material doped with an n-type impurity.

A bit line 190 may be provided on the drain 180. The drain 180 and bit lines 190 and 550 may be connected to each other via contact plugs.

Each gate electrode 120 and the channel layer 160 facing each gate electrode 120 in a horizontal direction with respect to the substrate 101 may constitute the memory cell MC. That is, the memory cell MC may have a circuit structure in which a transistor including the gate electrode 120 and the channel layer 160 and the charge trap layer 140 are connected in parallel.

The memory cell MC may be continuously arranged in a vertical direction with respect to the substrate 101 to constitute a cell string CS. The common source line CSL and the bit line BL may be connected to both ends of the cell string CS, as shown in the circuit diagram of FIG. 4 below. A voltage may be applied to the common source line CSL and the bit line BL so that programming, reading and erasing operations may be performed on a plurality of memory cells MC.

For example, when a memory cell MC to be written is selected, a gate voltage value of a corresponding cell may be adjusted so that no channel may be formed in the selected memory cell MC, i.e., the selected memory cell MC may be in a channel-off state, and gate voltage values of the unselected cells may be adjusted so that the unselected memory cells may be in channel-on states. Thus, a current path by the voltage applied to the common source line CSL and the bit line BL may pass through the selected memory cell MC, and desired information of 1 or 0 may be recorded in the selected memory cell MC.

Even during a reading operation, similarly, reading on the selected cell may be performed. For example, after the gate voltage applied to each gate electrode 120 is adjusted so that the selected memory cell MC is in a channel-off state and the unselected memory cells are in channel-on states, a current flowing through the corresponding cell MC may be measured due to the applied voltage $V_{read}$ between the common source line CSL and the bit line BL so that a cell state (logical '1' or '0') may be checked.

Referring to FIG. 4, k*n of cell strings CS may be provided, may be arranged in a matrix form, and may be referred to as CSij ($1 \leq i \leq k$, $1 \leq j \leq n$) according to each row and column position. In some example embodiments, k may be the same as, greater than, or equal to n. Each cell string CSij may be connected to the bit line BL, the string selection line CSL, the word line WL, and the common source line CSL.

Each cell string CSij may include memory cells MC and a string selection transistor SST. Memory cells MC and the string selection transistor SST of each cell string CSij may be stacked in a height direction.

Rows of a plurality of memory cells CS may be connected to different string selection lines SSL1 to SSLk. For example, the string selection transistors SSTs of the cell strings CSl1 to CSln may be commonly connected to the string selection line SSL1. String selection transistors SST of cell strings CSk1 to CSkn may be commonly connected to the string selection line SSLk.

Columns of a plurality of cell strings CS may be connected to different bit lines 190 (BLl to BLn). For example, memory cells of the cell strings CSl1 to CSk1 and the string selection transistors SST may be commonly connected to the bit line 190 (BL1), and the memory cells MC of the cell strings CSln to CSkn and the string selection transistors SST may be commonly connected to the bit line 190 (BLn).

Rows of a plurality of memory cells CS may be connected to different string selection lines SSL1 to SSLk. For example, the string selection transistors SST of the cell strings CSl1 to CSln may be commonly connected to the common source line CSL1, and the string selection transistors SST of the cell strings CSk1 to CSkn may be commonly connected to the common source line CSLk.

The memory cells MC located at the same heights from the substrate 101 or the string selection transistors SST may be commonly connected to one word line WL, and the memory cells MC located at different heights may be connected to different word lines WL1 to WLm, respectively.

The illustrated circuit structure is illustrative. For example, the number of rows of the cell strings CS may be increased or decreased. As the number of rows of the cell string CS is changed, the number of string selection lines connected to the rows of the cell string CS, and the number of cell strings CS connected to one bit line 190 may also be changed. As the number of rows of the cell string CS is changed, the number of common source lines connected to the rows of the cell strings CS may also be changed.

The number of columns of the cell strings CS may also be increased or decreased. As the number of the columns of the cell string CS is changed, the number of bit lines 190 connected to the columns of the cell strings CS, and the number of the cell string CS connected to one string selection line may also be changed.

The height of the cell string CS may also be increased or decreased. For example, the number of memory cells MC stacked in each cell string CS may be increased or decreased. As the number of memory cells MC stacked in each cell string CS is changed, the number of word lines WL may also be changed. For example, a string selection transistor provided to each cell string CS may be increased. As the number of string selection transistors provided in each cell string CS is changed, the number of string selection lines or the number of common source lines may also be changed. When the number of string selection transistors is increased, the string selection transistors may be stacked in the same form as that of the memory cells MC.

For example, writing and reading may be performed in the unit of rows of the cell strings CS. Cell strings CS may be selected in units of one row by a common source line CSL, and the cell strings CS may be selected in units of one row by the string selection lines SSL. In addition, a voltage may be applied to at least two common source lines CSL as one unit. A voltage may be applied to the entire common source lines CSL as one unit.

In a selected row of the cell strings CS, writing and reading may be performed in units of pages. The page may be one row of memory cells connected to one word line WL. In a selected row of cell strings, memory cells may be selected by word lines WLs in units of pages.

FIGS. 5A through 5G are reference views for describing a method for fabricating a nonvolatile memory device according to some example embodiments.

Figure 5A:
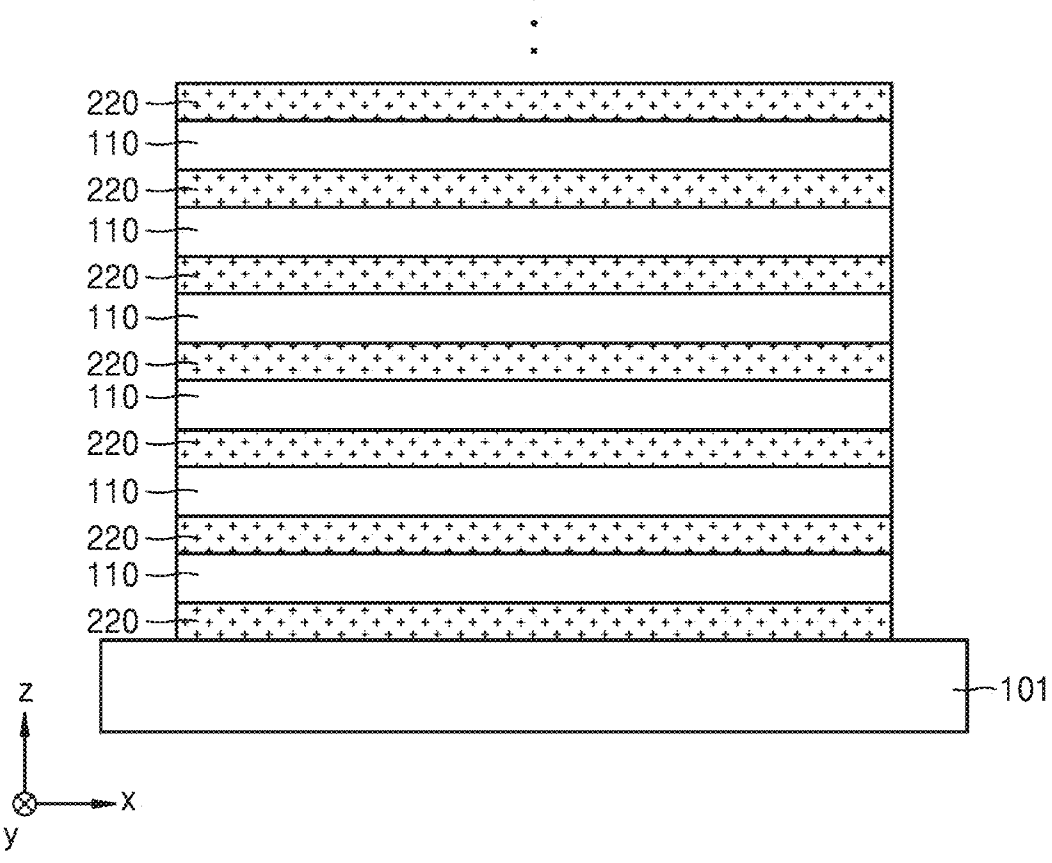
FIGS. 5A through 5G are reference views for describing a method for fabricating a nonvolatile memory device according to some example embodiments.

As shown in FIG. 5A, a sacrificial layer 220 and an insulating layer 110 may be alternately stacked on the substrate 101. The sacrificial layer 220 and the insulating layer 110 may be alternately stacked in a direction perpendicular to the surface of the substrate 101. The sacrificial layer 130 may include, for example, a silicon oxide, a silicon nitride, but embodiments are not limited thereto. The sacrificial layer 220 may be formed by various deposition methods such as one or more of chemical vapor deposition (CVD), atomic layer deposition (ALD), physical vapor deposition (PVD), and the like.

Figure 5B:
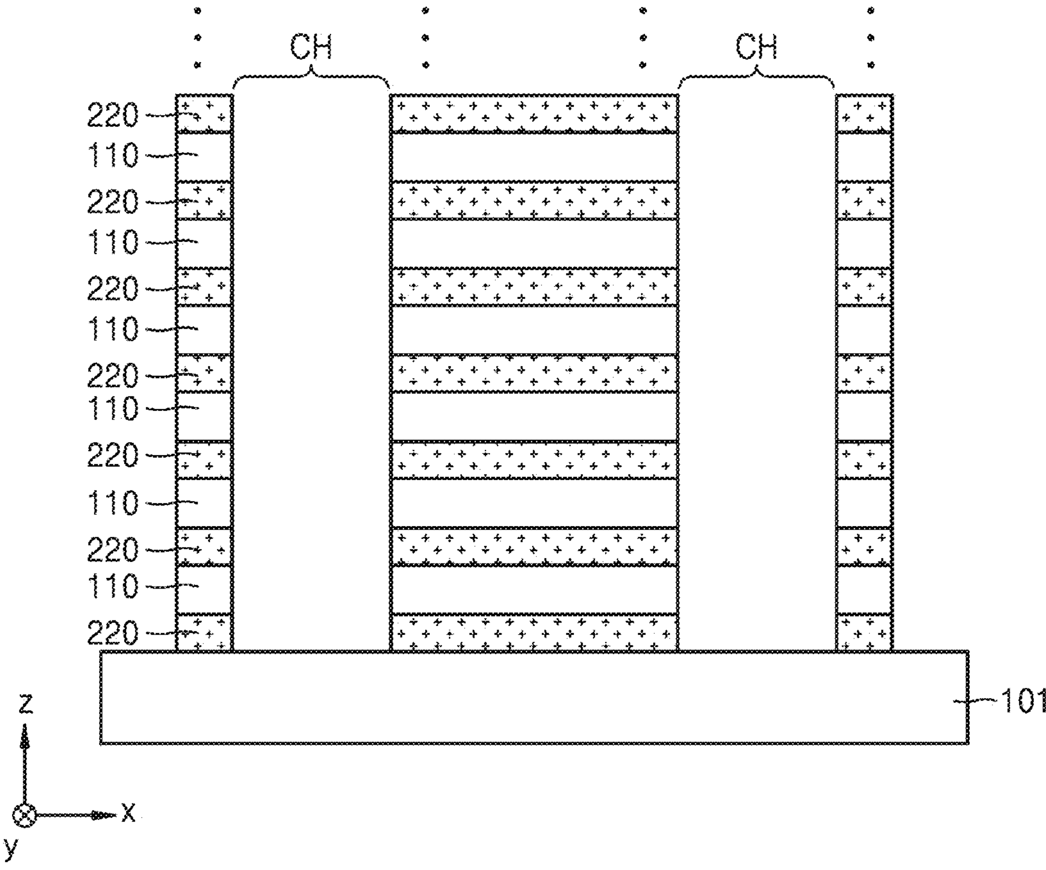

As shown in FIG. 5B, a first opening 230 may be formed by etching, e.g. anisotropically etching with a process such as a reactive ion etching process, of the sacrificial layer 220 and the insulating layer 110 to penetrate the sacrificial layer 220 and the insulating layer 110. A channel hole CH may be formed in the first opening 230. Here, the channel hole CH may be formed to extend in the direction perpendicular to the surface of the substrate 101. The channel hole CH may be formed to have a circular cross-section.

Figure 5C:
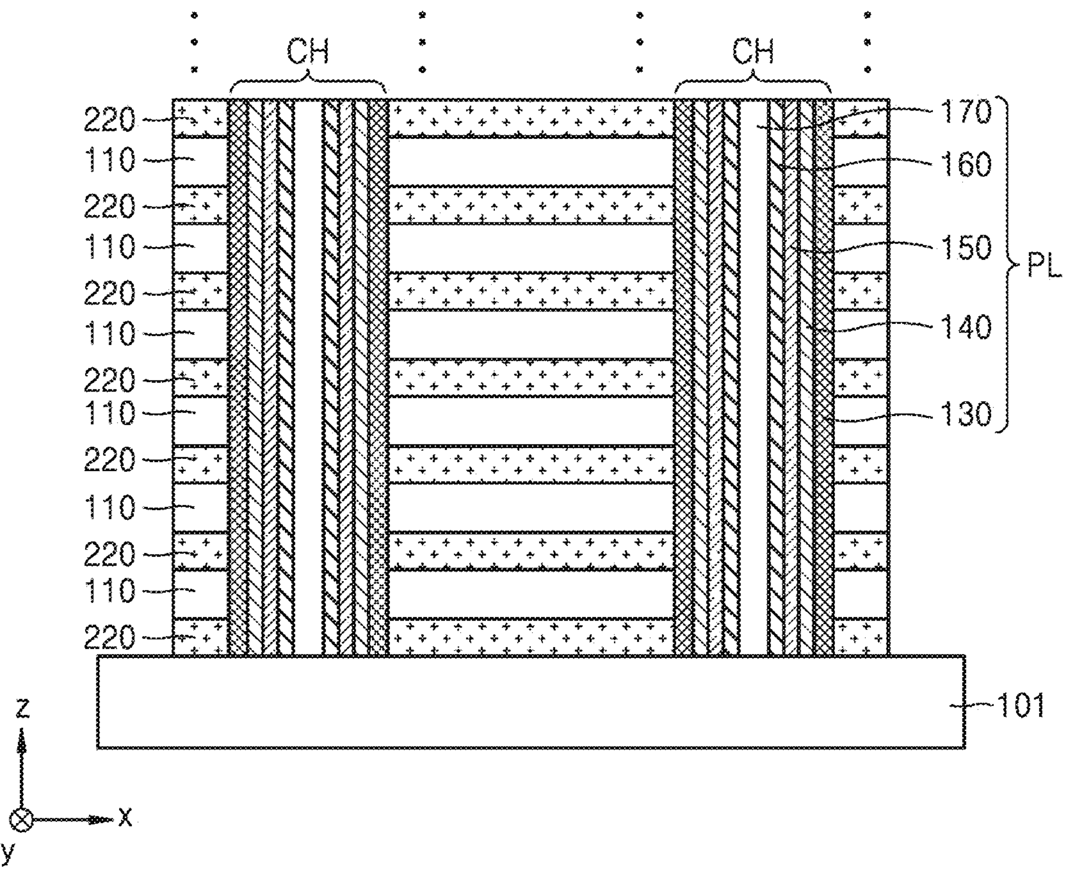

As shown in FIG. 5C, a pillar such as a cylindrical pillar PL may be formed on an inner wall of the channel hole CH. The pillar PL may include a plurality of layers. The pillar PL may include a charge blocking layer 130, a charge trap layer 140, a charge tunneling layer 150, a channel layer 160, and a filling layer 170. The charge blocking layer 130, the charge trap layer 140, the charge tunneling layer 150, the channel layer 160, and the filling layer 170 may be sequentially formed on the inner wall of the channel hole CH. The charge blocking layer 130, the charge trap layer 140, the charge tunneling layer 150, the channel layer 160, and the filling layer 170 may be formed to extend in the direction perpendicular to the surface of the substrate 101. The charge blocking layer 130 may be formed on the inner wall of the channel hole CH to be in contact with the sacrificial layer 220 and the insulating layer 110, and the charge trap layer 140 may be formed to be in contact with an inner wall of the charge blocking layer 130, and the charge tunneling layer 150 may be formed to be in contact with the inner wall of the charge trap layer 140. The channel layer 160 may be formed to be in contact with the charge tunneling layer 150. The filling layer 170 may be further formed in the channel layer 160.

Figure 5D:
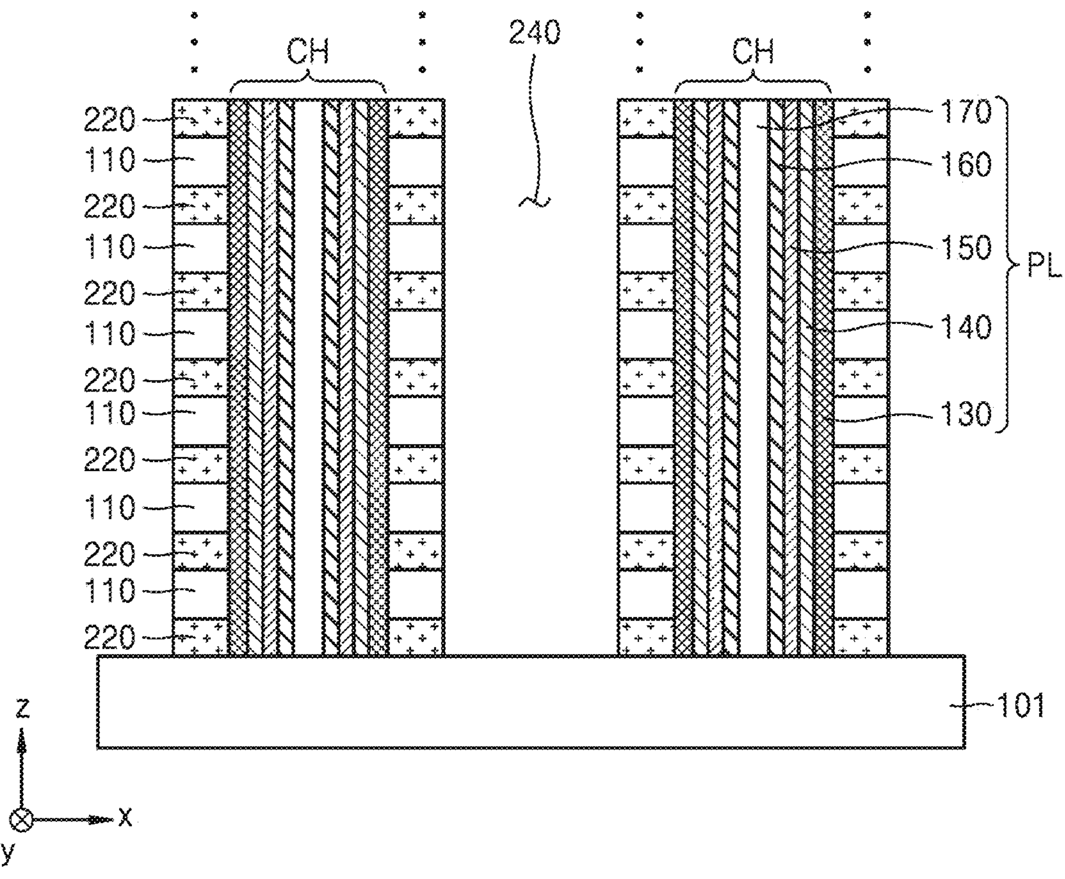

As shown in FIG. 5D, a second opening 240 may be formed by etching the sacrificial layers 220 and the insulating layers 110. A portion of the substrate 101 may be exposed through the second opening 240. A diameter of the second opening 240 may be the same as or different from (e.g., greater than or less than) those of the channel holes CH.

Figure 5E:
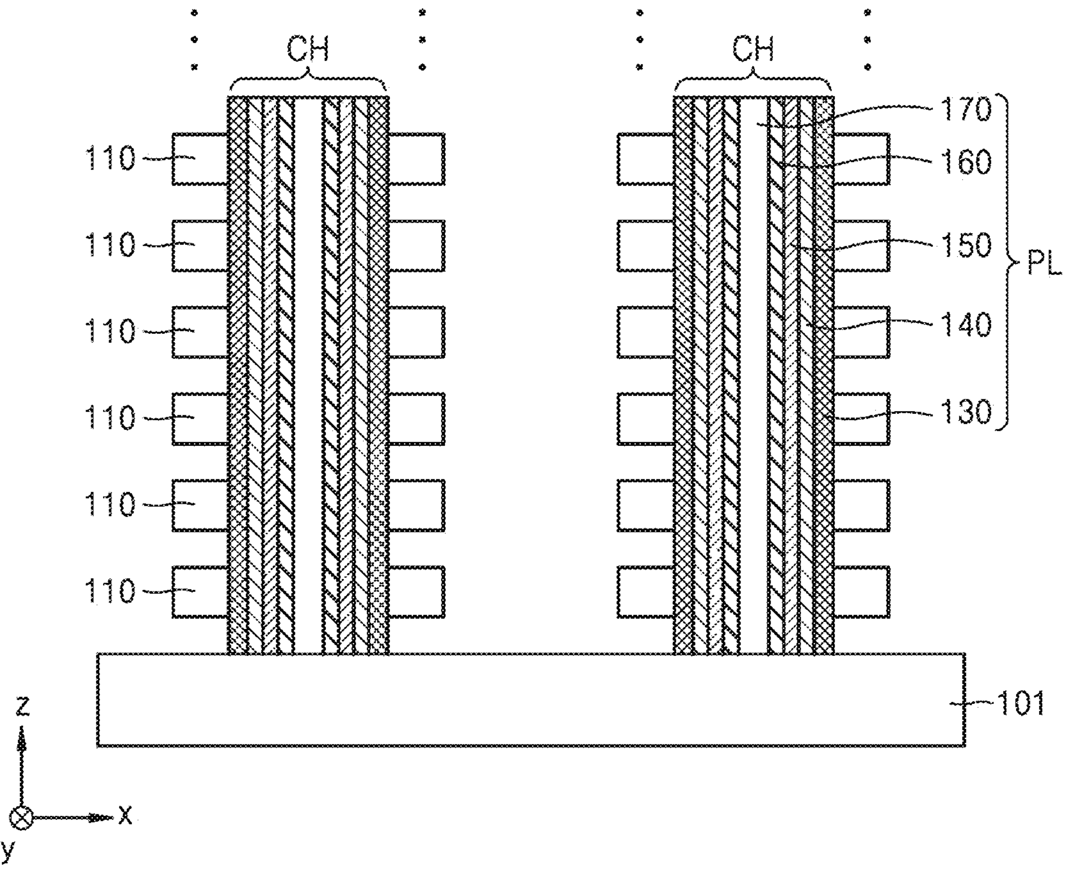

As shown in FIG. 5E, the sacrificial layer 220 may be removed to expose the insulating layer 110.

Figure 5F:
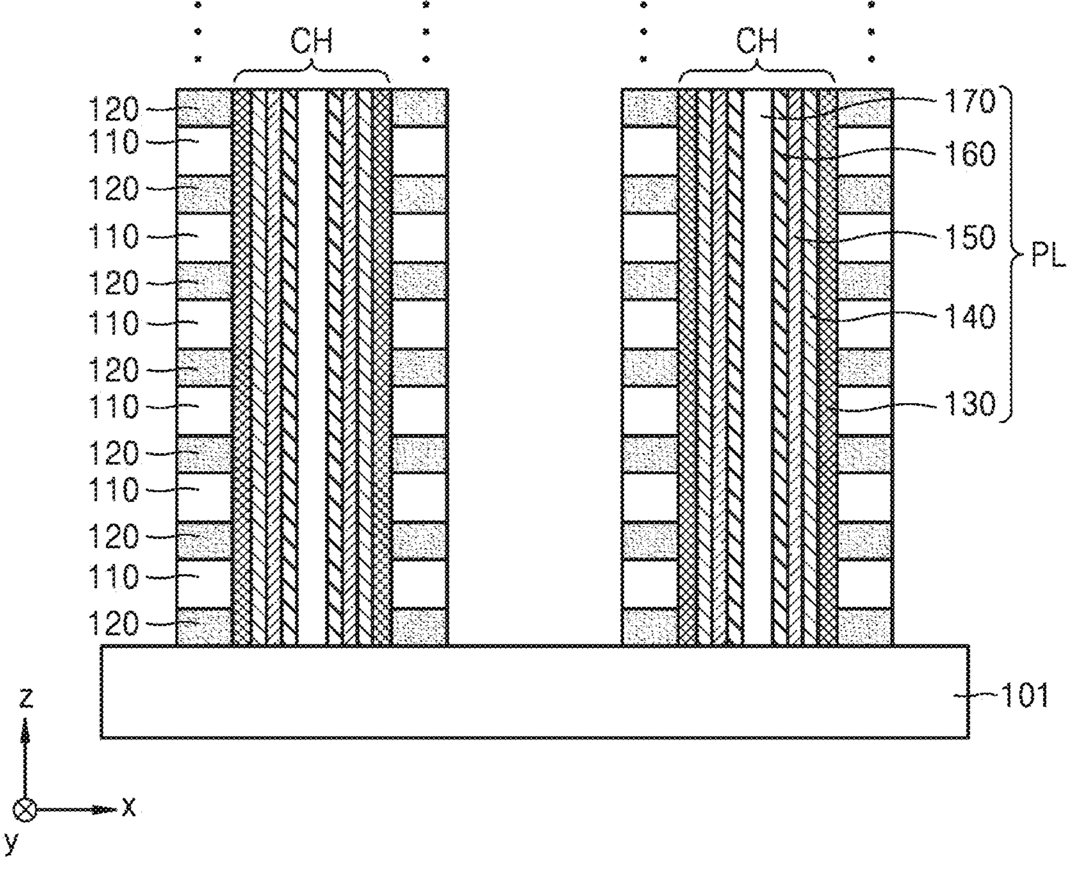

As shown in FIG. 5F, a gate electrode 120 may be formed in a region in which the sacrificial layer 220 is removed.

Figure 5G:
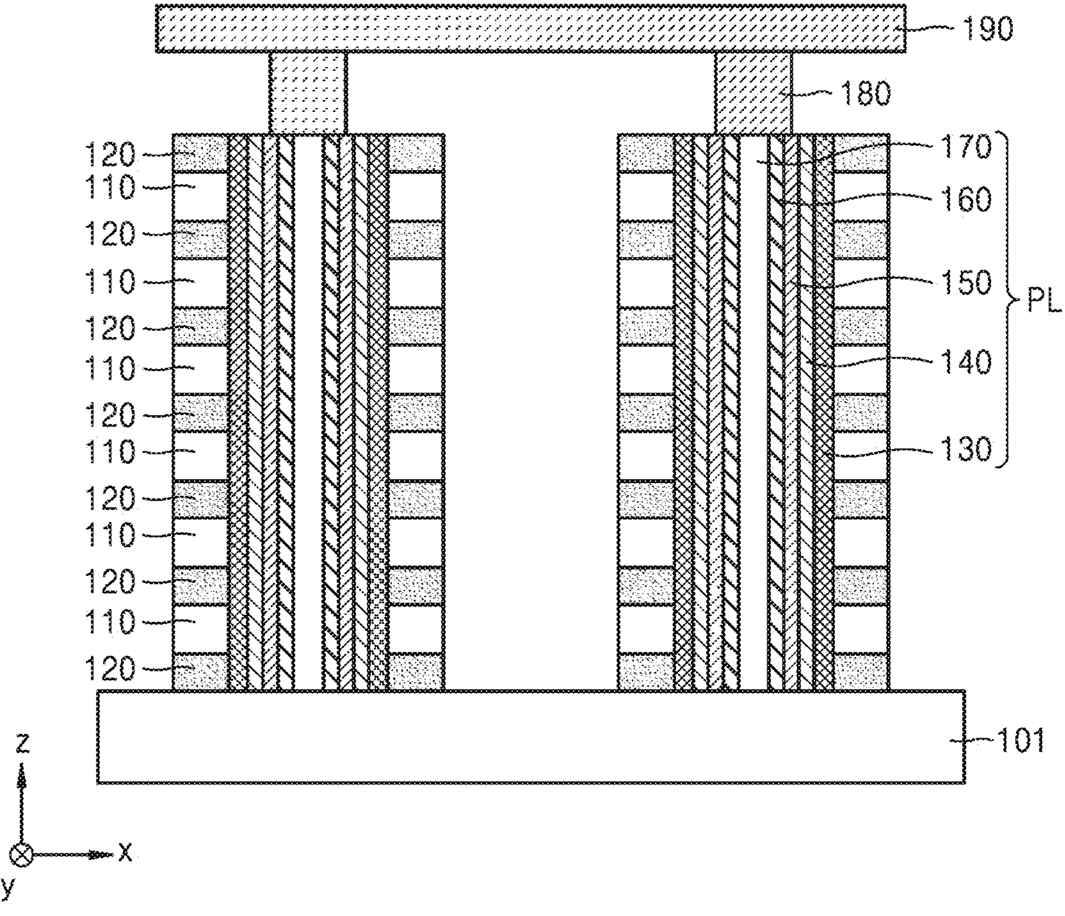

As shown in FIG. 5G, a drain 180 may be provided on the pillar PL. The drain 180 may include a silicon material doped with a second type impurity. For example, the drain 180 may include a silicon material doped with an n-type impurity. A bit line 190 may be provided on the drain 180. The drain 180 and bit lines 190 and 550 may be connected to each other via contact plugs. A doping region may be additionally provided to the substrate 101.

Figure 6:
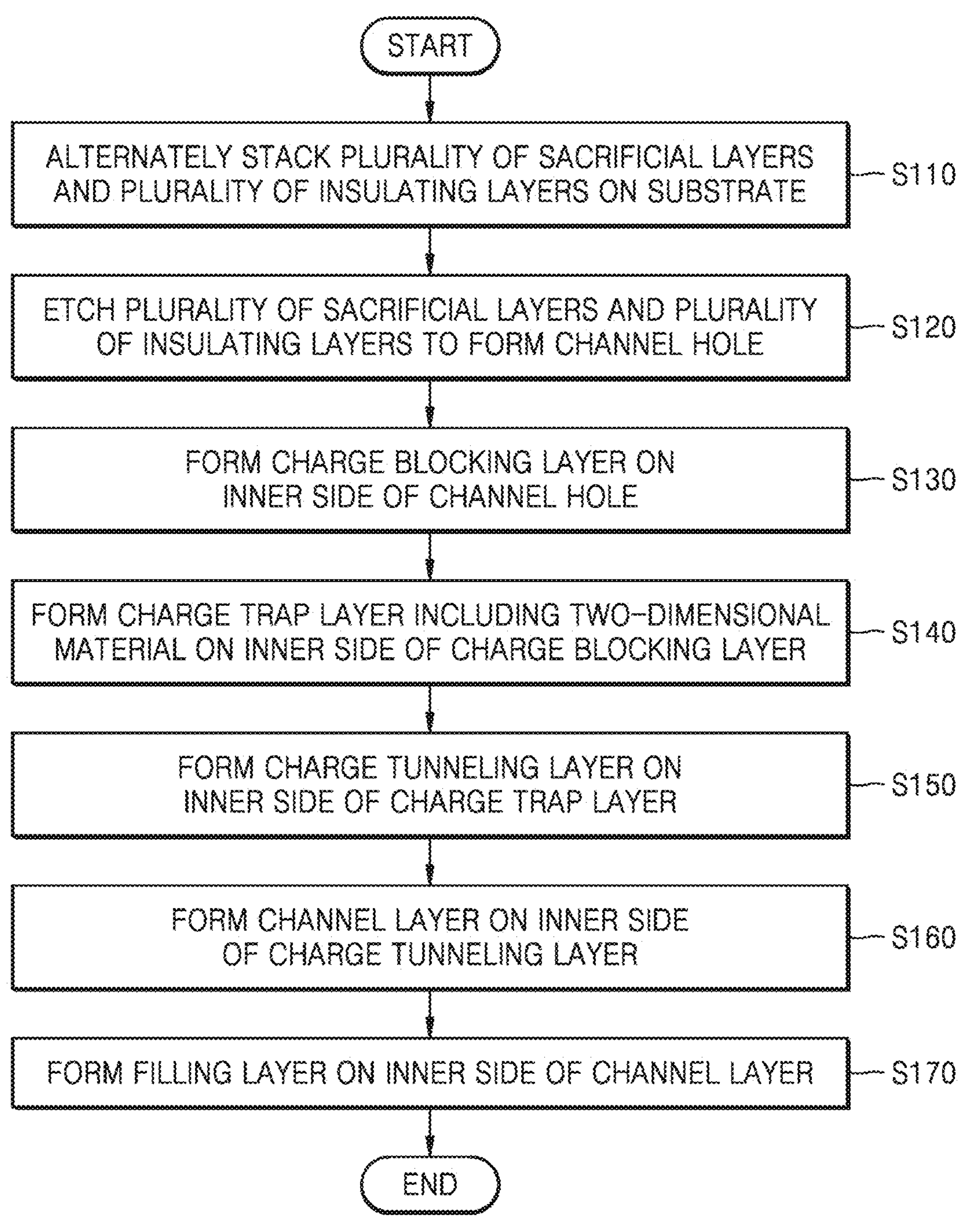
FIG. 6 is a flowchart illustrating a procedure of fabricating a nonvolatile memory device according to some example embodiments.

FIG. 6 is a flowchart illustrating a procedure of fabricating a nonvolatile memory device according to some example embodiments.

Referring to FIG. 6, a procedure of fabricating a nonvolatile memory device may include alternately stacking a plurality of sacrificial layers and a plurality of insulating layers (S110), etching the plurality of sacrificial layers and the plurality of insulating layers to form a channel hole (S120), forming a charge blocking layer on an inner side of the channel hole (S130), forming a charge tunneling layer including a two-dimensional material on an inner side of the charge blocking layer (S140), forming a charge tunneling layer on an inner side of the charge trap layer (S150), forming a channel layer on the inner side of the charge tunneling layer (S160), and forming a filling layer on the inner side of the channel layer (S170).

Figure 7:
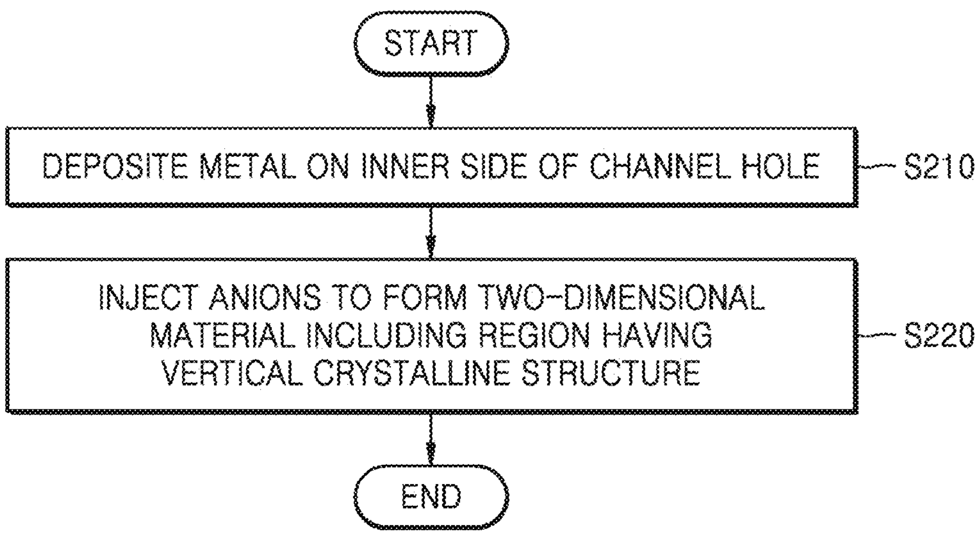
FIG. 7 is a flowchart illustrating a procedure of forming a charge trap layer including a two-dimensional material according to some example embodiments.

FIG. 7 is a flowchart illustrating a procedure of forming a charge trap layer including a two-dimensional material according to some example embodiments.

Referring to FIG. 7, the forming of the charge trap layer including the two-dimensional material may include depositing metal on the channel hole (S210) and injecting anions (e.g., S-gas) into the channel hole on which metal is deposited, to form a two-dimensional material including an inclined crystalline structure (e.g., a vertical crystalline structure) with respect to one surface of the channel layer (S220).

Figure 8:
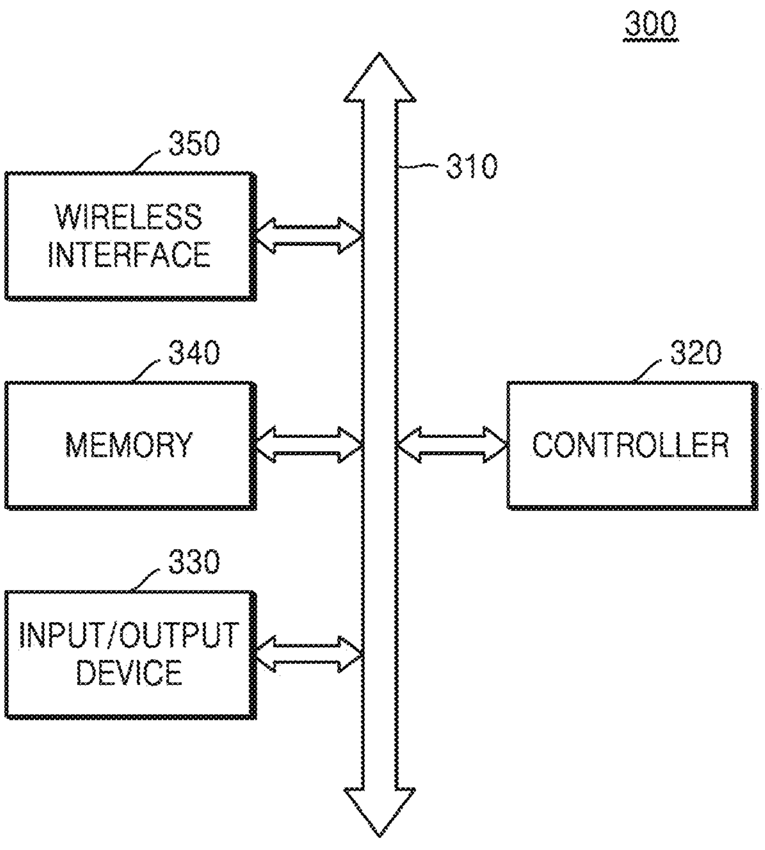
FIG. 8 is a block diagram schematically describing an electronic apparatus including a nonvolatile memory device according to some example embodiments.

FIG. 8 is a block diagram schematically describing an electronic apparatus 300 including a nonvolatile memory device according to some example embodiments.

Referring to FIG. 8, the electronic apparatus 300 according to some example embodiments may be one of a personal digital assistant (PDA), a laptop computer, a portable computer, a web tablet, a wireless telephone, a mobile phone, a digital music player, a wired/wireless electronic device, or a composite electronic apparatus including at least two of them. The electronic apparatus 300 may include an input/output device 330, such as a controller 320, a keypad, a keyboard, and a display that are combined with each other via a bus 310, a memory 340, and a wireless interface 350.

The controller 320 may include, for example, one or more microprocessors, digital signal processors, microcontrollers, or like. The memory 340 may be used to store command languages executed by the controller 320, for example.

The memory 340 may be used to store user data. The memory 340 may include a nonvolatile memory device 100 according to some example embodiments.

The electronic apparatus 300 may use the wireless interface 350 so as to transmit data to a wireless communication network for communicating with a radio frequency (RF) signal and/or to receive data from the wireless communication network. For example, the wireless interface 350 may include one or more of an antenna, a wireless transceiver, and the like. The electronic apparatus 300 may be used in a communication interface protocol such as a 3rd communication system such as one or more of code division multiple access (CDMA), global system/standard for mobile communications (GSM), naval air development center (NADC), extended time division multiple access (E-TDMA), wideband code division multiple access (WCDAM), or CDMA2000.

Figure 9:
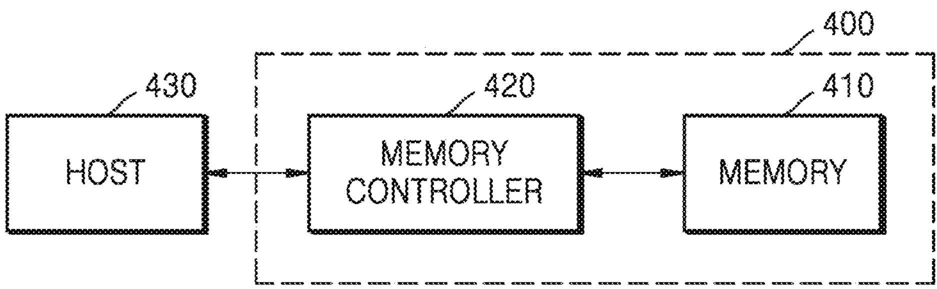
FIG. 9 is a block diagram schematically describing a memory system including a nonvolatile memory device according to some example embodiments.

FIG. 9 is a block diagram schematically describing a memory system including a nonvolatile memory device according to some example embodiments.

Referring to FIG. 9, nonvolatile memory devices 100 according to some example embodiments may be used to implement a memory system 400. The memory system 400 may include a memory 410 for storing a large amount of data and a memory controller 420. The memory controller 420 may control the memory 410 to read or write stored data from or into the memory 410 in response to a reading/writing request of a host 430. The memory controller 420 may constitute an address mapping table for mapping an address provided from the host 430, for example, a mobile device or a computer system into a physical address of the memory 410. The memory 410 may include a semiconductor memory device 100 according to some example embodiments.

The memory device 100 according to some example embodiments described above may be implemented in the form of a chip and may be used as a neuromorphic computing platform. For example, the memory device 100 may be applied to a neuromorphic device of FIG. 10 below.

Figure 10:
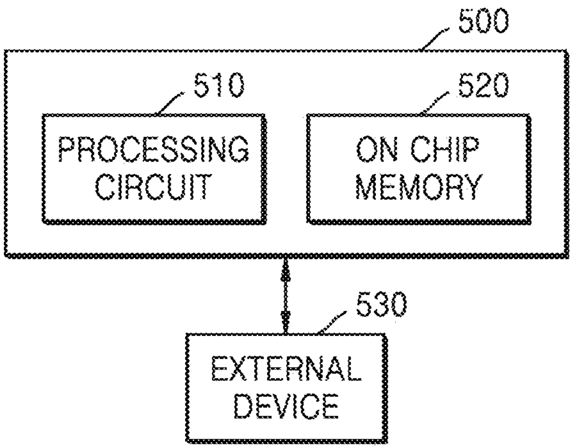
FIG. 10 is a block diagram schematically illustrating a neuromorphic apparatus including a memory device according to some example embodiments.

FIG. 10 is a block diagram schematically illustrating a neuromorphic device including a memory device according to some example embodiments.

Referring to FIG. 10, a neuromorphic device 500 may include a processing circuit 510 and/or a memory 520. The memory 520 of the neuromorphic device 500 may include a memory system 400 according to some example embodiments.

The processing circuit 510 may be configured to control functions for driving the neuromorphic device 500. For example, the processing circuit 510 may execute a program stored in the memory 520 of the neuromorphic device 500 to control the neuromorphic device 500.

The processing circuit 510 may include a combination of hardware such as a logic circuit and software for executing software, or a combination thereof. For example, the processor may include or be included in one or more of a central processing unit (CPU), a graphics processing unit (GPU), an application processor (AP) within the neuromorphic device 500, an arithmetic logic unit (ALU), a digital processor, a microcomputer, a field programmable gate array (FPCA), System-on-Chip (SoC), a programmable logic unit, an application-specific integrated circuit (ASIC), or the like.

Also, the processing circuit 510 may read/write various data from/into an external device 1030 and may execute the neuromorphic device 500 using the data. The external device 1030 may include a sensor array including an external memory and/or an image sensor (e.g., a CMOS image sensor circuit).

The neuromorphic device 500 shown in FIG. 10 may be applied to a machine learning system. The machine learning system may utilize various artificial neural network organizations and processing models, including, for example, one or more of a convolutional neural network (CNN), a convolutional neural network, a long short-term memory (LSTM network), and/or a gated recurrent unit (GRU), a deep belief network (SNN), generative adversarial networks (SSDNN), restricted Boltzmann networks (RBM), and the like.

Such machine learning systems may include, for example, one or more of linear regression and/or logistic regression, statistical clustering, Bayesian classification, decision trees, dimensionality reduction such as principal component analysis, and other types of machine learning models, such as expert systems, and/or combinations thereof, including ensemble techniques such as random forest. The machine learning model may be used to provide various services such as an image classification service, biometric information or biometric data, a user authentication service based on biometric information or biometric data, an advanced driver assistance system (ADAS), a voice assistant service, an automatic speech recognition (ASR) service, and the like, and may be installed and executed in another electronic apparatus.

In the nonvolatile memory device and the method for fabricating the same described above, a nonvolatile memory with reduced lateral charge spreading of a charge trap layer may be provided.

Alternatively or additionally, in the nonvolatile memory device and the method for fabricating the same described above, a nonvolatile memory, in which high integration may be more easily implemented, may be provided.

It should be understood that various embodiments described herein should be considered in a descriptive sense only and not for purposes of limitation. Descriptions of features or aspects within each embodiment should typically be considered as available for other similar features or aspects in other example embodiments, and examples are not necessarily mutually exclusive with one another. While one or more example embodiments have been described with reference to the figures, it will be understood by those of ordinary skill in the art that various changes in form and details may be made therein without departing from the spirit and scope as defined by the following claims.

What is claimed is:

1. A nonvolatile memory device comprising:
a channel layer extending in a first direction;
a plurality of gate electrodes and a plurality of insulating layers that are spaced apart from the channel layer and being alternately arranged in the first direction;
a charge trap layer between the channel layer and the plurality of gate electrodes; and
a charge tunneling layer between the channel layer and the charge trap layer,
wherein the charge trap layer comprises a two-dimensional material, and the two-dimensional material comprises a crystalline structure having atoms arranged in an x-y plane that is inclined with respect to a surface of the channel layer.

2. The nonvolatile memory device of claim 1, wherein the two-dimensional material comprises a chalcogenide compound.

3. The nonvolatile memory device of claim 2, wherein a chemical formular of the chalcogenide compound is $M_1N_x$, the M is one of Ti, Hf, Zr, V, Nb, Ta, Mo, W, Tc, Re, Pd, Pt, Bi, Sb, La, Ce, Pr, Nd, Sm, Eu, Gd, Tb, Dy, Ho, Er, Tm, Yb, and Lu, the N is one of S, Se, and Te, and the x is greater than or equal to 1 and less than or equal to 3.

4. The nonvolatile memory device of claim 1, wherein the two-dimensional material comprises a metal oxide.

5. The nonvolatile memory device of claim 4, wherein the metal oxide comprises at least one selected from the group including $TiO_x$ ($1 \leq x \leq 2$), $MnO_2$, $TiNbO_5$, $Ti_2NbO_7$, $TiTaO_5$, $Nb_3O_8$, $Nb_6O_{17}$, $TaO_3$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_2$, and $Cs_4W_{11}O_{36}$.

6. The nonvolatile memory device of claim 1, wherein the two-dimensional material comprises graphene.

7. The nonvolatile memory device of claim 1, wherein the two-dimensional material comprises boron nitride.

8. The nonvolatile memory device of claim 1, wherein the two-dimensional material comprises at least one metal cation and at least one anion, and a ratio of a number of metal cations with respect to a number of anions at an interface of the charge trap layer is greater than a ratio of the number of the metal cations with respect to the number of anions in all of the charge trap layer.

9. The nonvolatile memory device of claim 1, wherein the charge trap layer defines a void region.

10. The nonvolatile memory device of claim 1, wherein the charge trap layer comprises silicon (Si).

11. The nonvolatile memory device of claim 1, wherein
the crystalline structure of the two-dimensional material comprises a plurality of atomic layers, and
a distance between adjacent atomic layers of the crystalline structure of the plurality of atomic layers is greater than or equal to 0.1 nm and less than or equal to 5 nm.

12. The nonvolatile memory device of claim 1, wherein the two-dimensional material comprises at least one metal atom, and the at least one metal atom is in contact with the charge tunneling layer.

13. A nonvolatile memory device comprising:
a channel layer extending in a first direction;
a plurality of gate electrodes and a plurality of insulating lavers that are spaced apart from the channel layer and being alternately arranged in the first direction;
a charge trap layer between the channel layer and the plurality of gate electrodes; and
a charge tunneling layer between the channel layer and the charge trap layer, wherein the charge trap layer comprises a two-dimensional material, and the two-dimensional material comprises a crystalline structure that is inclined with respect to the channel layer, wherein the charge trap layer comprises a region having the crystalline structure in which an angle formed between an x-y plane of the two-dimensional material and the channel layer is greater than or equal to 45 degrees and less than or equal to 90 degrees.

14. The nonvolatile memory device of claim 13, wherein the two-dimensional material comprises a chalcogenide compound.

15. The nonvolatile memory device of claim 14, wherein a chemical formular of the chalcogenide compound is $M_1N_x$, the M is one of Ti, Hf, Zr, V, Nb, Ta, Mo, W, Tc, Re, Pd, Pt, Bi, Sb, La, Ce, Pr, Nd, Sm, Eu, Gd, Tb, Dy, Ho, Er, Tm, Yb, and Lu, the N is one of S, Se, and Te, and the x is greater than or equal to 1 and less than or equal to 3.

16. The nonvolatile memory device of claim 13, wherein the two-dimensional material comprises a metal oxide.

17. The nonvolatile memory device of claim 13, wherein the two-dimensional material comprises Mxene.

18. The nonvolatile memory device of claim 13, wherein the two-dimensional material comprises at least one metal atom, and the at least one metal atom is in contact with the charge tunneling layer.

19. A nonvolatile memory device comprising:

a channel layer extending in a first direction;

a plurality of gate electrodes and a plurality of insulating layers that are spaced apart from the channel layer and being alternately arranged in the first direction;

a charge trap layer between the channel layer and the plurality of gate electrodes; and a charge tunneling layer between the channel layer and the charge trap layer, wherein the charge trap layer comprises a two-dimensional material, and the two-dimensional material comprises a crystalline structure that is inclined with respect to the channel layer, wherein the two-dimensional material comprises Mxene.

20. The nonvolatile memory device of claim 19, wherein the Mxene comprises at least one selected from the group including $Ti_2C$, $V_2C$, $Nb_2C$, $Mo_2C$, $Ti_3C_2$, $Zr_3C_2$, $Nb_4C_3$, $Ta_4C_3$, $Ti_4N_3$, TiNbC, $(Ti_{0.5}Nb_{0.5})_2C$, $(V_{0.5}Cr_{0.5})_3C_2$, $Ti_3CN$, $Mo_2TiC_2$, $Mo_2ScC_2$, $Cr_2TiC_2$, $Mo_2Ti_2C_3$, $(Nb_{0.8}Ti_{0.2})_4C_3$, and $(Nb_{0.8}Zr_{0.2})_4C_3$.

* * * * *